United States Patent
Shen et al.

(10) Patent No.: US 11,094,827 B2
(45) Date of Patent: Aug. 17, 2021

(54) SEMICONDUCTOR DEVICES WITH UNIFORM GATE HEIGHT AND METHOD OF FORMING SAME

(71) Applicant: GLOBALFOUNDRIES U.S. INC., Santa Clara, CA (US)

(72) Inventors: Yanping Shen, Saratoga Springs, NY (US); Xiaoxiao Zhang, Clifton Park, NY (US); Shesh Mani Pandey, Saratoga Springs, NY (US); Hui Zang, Guilderland, NY (US)

(73) Assignee: GLOBALFOUNDRIES U.S. Inc., Santa Clara, CA (US)

( * ) Notice: Subject to any disclaimer, the term of this patent is extended or adjusted under 35 U.S.C. 154(b) by 68 days.

(21) Appl. No.: 16/434,136

(22) Filed: Jun. 6, 2019

(65) Prior Publication Data

US 2020/0388707 A1    Dec. 10, 2020

(51) Int. Cl.
| | |
|---|---|
| *H01L 29/78* | (2006.01) |
| *H01L 29/51* | (2006.01) |
| *H01L 29/10* | (2006.01) |
| *H01L 21/311* | (2006.01) |
| *H01L 21/28* | (2006.01) |
| *H01L 29/66* | (2006.01) |
| *H01L 29/49* | (2006.01) |

(52) U.S. Cl.
CPC .... *H01L 29/7855* (2013.01); *H01L 21/28088* (2013.01); *H01L 21/31111* (2013.01); *H01L 29/1033* (2013.01); *H01L 29/4966* (2013.01); *H01L 29/518* (2013.01); *H01L 29/66545* (2013.01); *H01L 29/66795* (2013.01)

(58) Field of Classification Search
CPC combination set(s) only.
See application file for complete search history.

(56) References Cited

U.S. PATENT DOCUMENTS

| | | | |
|---|---|---|---|
| 9,293,551 B2 * | 3/2016 | Fan | H01L 29/4966 |
| 9,923,080 B1 | 3/2018 | Greene et al. | |
| 10,056,303 B1 | 8/2018 | Patil et al. | |
| 10,535,523 B1 * | 1/2020 | Lin | H01L 21/28556 |
| 2012/0139061 A1 * | 6/2012 | Ramachandran | H01L 29/78 257/410 |
| 2015/0200111 A1 | 7/2015 | Muralidharan et al. | |
| 2016/0064378 A1 * | 3/2016 | Kwon | H01L 29/7831 257/401 |
| 2016/0163601 A1 * | 6/2016 | Xie | H01L 21/823468 257/392 |
| 2019/0165123 A1 * | 5/2019 | Lo | H01L 21/28088 |
| 2019/0304972 A1 * | 10/2019 | Kim | H01L 21/28088 |
| 2020/0052106 A1 * | 2/2020 | Economikos | H01L 21/823468 |

\* cited by examiner

*Primary Examiner* — Nduka E Ojeh
(74) *Attorney, Agent, or Firm* — David Cain

(57) ABSTRACT

The present disclosure generally relates to semiconductor device fabrication and integrated circuits. More particularly, the present disclosure relates to replacement metal gate processes and structures for multi-gate transistor devices having a short channel and a long channel component.

20 Claims, 7 Drawing Sheets

SEMICONDUCTOR DEVICES WITH UNIFORM GATE HEIGHT AND METHOD OF FORMING SAME

FIELD OF THE INVENTION

The present disclosure generally relates to semiconductor device fabrication and integrated circuits. More particularly, the present disclosure relates to replacement metal gate processes and structures for multi-gate transistor devices having a short channel and a long channel component.

BACKGROUND

The semiconductor industry's drive for higher density, higher performance, lower-cost devices and the implementation of nanometer-scale process nodes have resulted in the development of various transistor device architectures, such as three-dimensional (3D) fin-shaped field effect transistors (FinFETs), and planar transistor devices built on bulk substrates or substrates with a buried insulator layer (i.e., semiconductor-on-insulator device).

Additionally, multi-gate transistors (e.g., tri-gate transistors) are increasingly integrated into semiconductor devices. Performance of multi-gate devices may be optimized by adjusting various properties/characteristics of the gate, such as the height dimension of the gate, the work-function component, the gate dielectric component, the dopant concentration of the channel, the length of the channel, and the types of materials used in the gate components.

A possible approach to optimize multi-gate device performance is to reduce the height dimension of the gate by employing chemical mechanical planarization (CMP) processes to recess the top surface of the gate. However, limitations in conventional CMP techniques have resulted in the undesirable formation of a concave top surface on the recessed gate, hereinafter referred to as "CMP dishing". The greater the extent of recessing the gate, the greater the extent of CMP dishing (e.g., a larger concavity). Accordingly, gate components such as gate electrode material and work function material are inadvertently eroded as a result of the CMP dishing, which damages the gate structure and limits the performance of multi-gate devices.

Therefore, there is a need to provide methods of forming structures in a semiconductor device that can overcome, or at least ameliorate, one or more of the disadvantages as described above.

SUMMARY

In an aspect of the present disclosure, there is provided a semiconductor device having first and second gate structures disposed in a dielectric layer above an active region, the first gate structure has a first width that is smaller than a second width of the second gate structure, a lower portion of the first gate structure having a first work-function material (WFM) layer, the first WFM layer having a top surface, a lower portion of the second gate structure having a second WFM layer, the second WFM layer having a top surface, and a first gate electrode disposed in the first WFM layer and a second gate electrode having a lower portion disposed in the second WFM layer, where the first gate electrode has a first width that is smaller than a second width of the second gate electrode.

In another aspect of the present disclosure, there is provided a semiconductor device having a long channel and a short channel gate structures disposed in a dielectric layer above an active region, the long channel gate structure having a channel length that is longer than the short channel gate structure, a lower portion of the short channel gate structure having a first work-function material (WFM) layer, the first WFM layer having a top surface, a lower portion of the long channel gate structure having a second WFM layer, the second WFM layer having a top surface, a first gate electrode disposed in the first WFM layer and a second gate electrode having a lower portion disposed in the second WFM layer, the first gate electrode having a first width that is smaller than a second width of the second gate electrode, and the first gate electrode having a first height that is shorter than a second height of the second gate electrode.

In yet another aspect of the present disclosure, there is provided a method of forming structures in a semiconductor device by forming first and second gate cavities having sidewalls and bottom surfaces in a dielectric layer, where the first gate cavity has a width that is smaller than a width of the second gate cavity, forming a first gate structure in the first gate cavity by forming a first work-function material (WFM) layer with a top surface, followed by forming a first gate electrode with a top surface in the first WFM layer, forming a second gate structure in the second gate cavity by forming a second WFM layer with a top surface, followed by forming a second gate electrode with a top surface in the second WFM layer, recessing the top surfaces of the first and second WFM layers to a level below the top surface of the second gate electrode, recessing the top surface of the first gate electrode to a level coplanar with the recessed top surface of the first WFM layer, and forming a first gate cap dielectric layer over the first WFM layer and the first gate electrode and a second gate cap dielectric layer over the second WFM layer and the second gate electrode.

BRIEF DESCRIPTION OF THE DRAWINGS

The present disclosure may be understood by reference to the following description taken in conjunction with the accompanying drawings.

For simplicity and clarity of illustration, the drawings illustrate the general manner of construction, and certain descriptions and details of well-known features and techniques may be omitted to avoid unnecessarily obscuring the discussion of the described embodiments of the present disclosure. Additionally, elements in the drawings are not necessarily drawn to scale. For example, the dimensions of some of the elements in the drawings may be exaggerated relative to other elements to help improve understanding of embodiments of the present disclosure. The same reference numerals in different drawings denote the same elements, while similar reference numerals may, but do not necessarily, denote similar elements.

FIGS. 1 to 7 are cross-sectional views depicting successive stages of forming structures in a semiconductor device in accordance with embodiments of the present disclosure.

FIG. 1 illustrates a set of device features for forming structures in a semiconductor device in accordance with embodiments of the present disclosure.

FIG. 3 illustrates formation of a first gate structure in the first gate cavity, and a second gate structure in the second gate cavity, in accordance with embodiments of the present disclosure.

FIG. 4 illustrates recession of top surfaces of the first and second WFM layers, in accordance with embodiments of the present disclosure.

FIG. 5 illustrates recession of top surfaces of the first and second gate electrodes, in accordance with embodiments of the present disclosure.

FIG. 6 illustrates formation of first and second gate cap dielectric layers, in accordance with embodiments of the present disclosure.

FIG. 7 illustrates formation of an inter-layer dielectric on the structure of FIG. 6, in accordance with embodiments of the present disclosure.

DETAILED DESCRIPTION

Various illustrative embodiments of the present disclosure are described below. The embodiments disclosed herein are exemplary and not intended to be exhaustive or limiting to the present disclosure.

Figure 1:
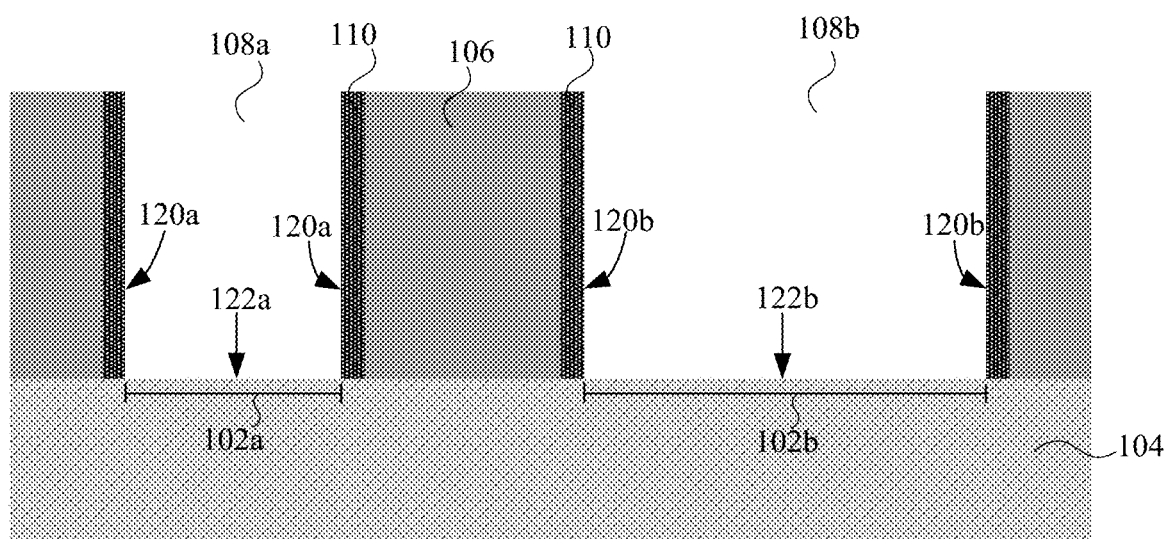

Referring to FIG. 1, a set of device features for forming a semiconductor device is shown, in accordance with the present disclosure. The device features may include a substrate (not shown in the accompanying drawings), an active region 104 formed on the substrate, and first and second gate cavities (108a and 108b, respectively) disposed above the active region 104. In some embodiments (not shown), the active region 104 includes a channel region flanked by a source contact and a drain contact. The device features may be formed by conventional semiconductor fabrication processes.

The active region 104 may be a fin, a doped layer on a top surface of a bulk semiconductor substrate or a semiconductor-on-insulator layer. In addition, the active region 104 may be made of any suitable semiconductor material, such as silicon, germanium, or silicon germanium. Although not shown in the accompanying drawings, the substrate may be made of any suitable semiconductor material, such as silicon (Si), germanium (Ge), silicon germanium (SiGe), silicon/carbon, other II-VI or III-V semiconductor compounds and the like. The substrate may also include an organic semiconductor or a layered semiconductor, such as Si/SiGe, a silicon-on-insulator or a SiGe-on-insulator.

The first and second gate cavities (108a and 108b, respectively) used to form the first and second gate structures may be formed after the removal of dummy gate material during replacement metal gate processes. The first and second gate cavities (108a and 108b, respectively) are disposed in a dielectric layer 106 and may be separated or electrically isolated from each other by a dielectric structure. The dielectric layer 106 may include a dielectric compound, such as silicon nitride (SiN), or silicon dioxide ($SiO_2$). Additionally, the first and second gate cavities (108a and 108b, respectively) may be flanked by sidewall spacer structures 110. As shown in FIG. 1, the lined first and second cavities (108a and 108b, respectively) have sidewall surfaces 120a and 120b, and bottom surfaces 122a and 122b. In some embodiments, the bottom surface 122a of the first cavity 108a is smaller than the bottom surface 122b of the second cavity 108b.

In some embodiments, the first gate cavity 108a has a width dimension 102a in the range of about 10 nm to about 30 nm, while the second gate cavity 108b has a width dimension 102b in the range of about 30 nm to about 300 nm. The width 102a of the first gate cavity 108a may be smaller than the width 102b of the second gate cavity 108b. In particular, the first gate cavity width 102a and the second gate cavity width 102b differ from each other in the range of about 20 nm to about 290 nm. In another embodiment, the width dimensions 102a and 102b correspond to the lengths of the channels below gate electrodes. In particular, the second gate cavity 108b has a longer channel length than the first gate cavity 108a.

The sidewall spacer structures 110 may function as a gate spacer to prevent an electrical short between electrically conductive components in the first and second gate cavities and the source/drain regions in the active region 104. The sidewall spacer structures 110 may include a low-K dielectric material, such as silicon dioxide ($SiO_2$), silicon oxide materials enriched or doped with atomic elements selected from the group consisting of carbon, boron, hydrogen and nitrogen (e.g., SiOCN, SiBCN), silicon oxynitride (SiON), SiGe oxide, germanium oxide, silicon oxycarbide, SiCOH dielectrics, or any combination thereof.

Figure 2A:
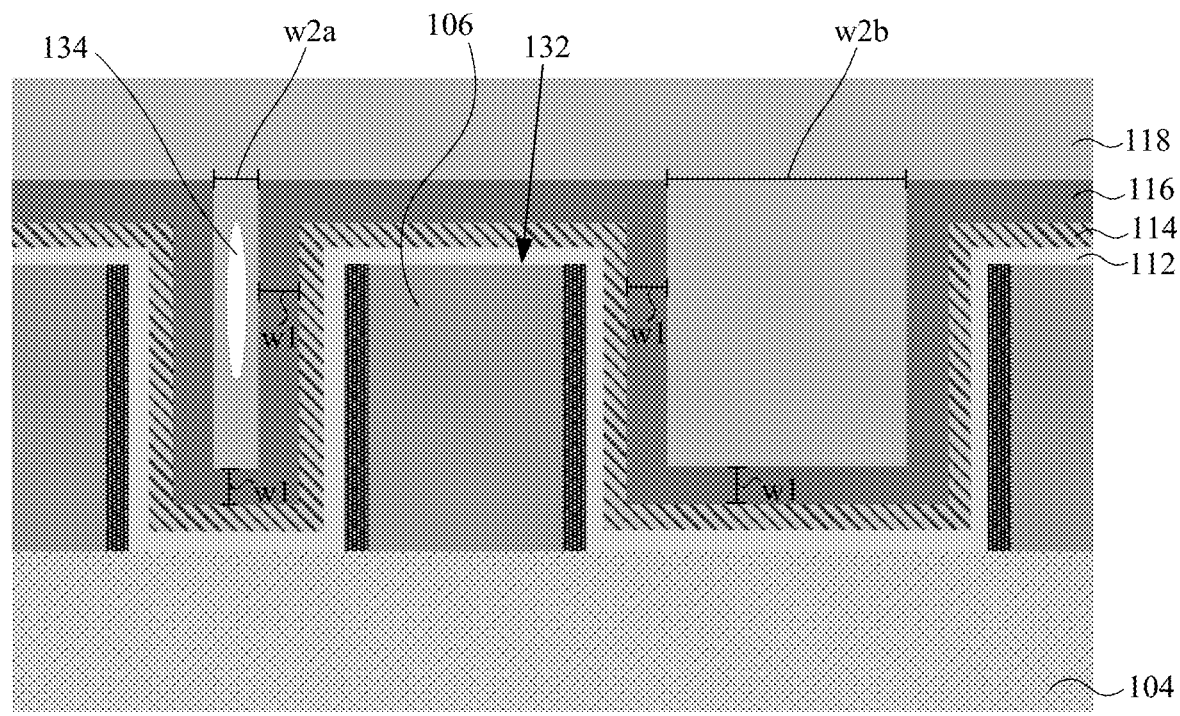
FIG. 2A illustrates an example of forming a work-function material (WFM) layer and a gate electrode material in the first and second gate cavities, in accordance with embodiments of the present disclosure.

Referring to FIG. 2A, a gate dielectric layer 112, a gate liner 114, a work-function material (WFM) layer 116 and a gate electrode material layer 118 are formed in the first and second cavities (108a and 108b, respectively). The gate dielectric layer 112, the gate liner 114, and the work-function material (WFM) layer 116 may be formed by conventional deposition processes, such as chemical vapor deposition (CVD), physical vapor deposition (PVD), molecular beam deposition (MBD), pulsed laser deposition (PLD), liquid source misted chemical deposition (LSMCD), atomic layer deposition (ALD), etc. However, a highly conformal deposition process is preferred for depositing the gate dielectric layer 112, the gate liner 114, and the work-function material (WFM) layer 116; for example, an ALD process or a highly-controlled CVD process.

For example, the gate dielectric layer 112 is deposited on and conforming to the sidewall surfaces and the bottom surfaces of the first and second gate cavities. The gate liner 114 is then deposited on the gate dielectric layer 112, followed by the deposition of the WFM layer 116 on the gate liner 114. The thickness of the deposited gate dielectric layer 112, the gate liner 114, and the work-function material (WFM) layer 116 is uniform, and hence the same in the first and second gate cavities (108a and 108b, respectively).

The conformal deposition of the WFM layer 116 in the first and second cavities (108a and 108b, respectively) may be controlled to retain a space w2a between opposing portions of the conformal WFM layer over the sidewalls of the first gate cavity 108a. For example, during the conformal deposition of the WFM layer 116, the directional increase of the thickness w1 of the WFM layer 116 extends along a direction vector laterally away from the sidewalls of the first gate cavity 108a. The directional increase of the thickness w1 of the WFM layer 116 may be controlled to retain the space w2a between opposing portions of the WFM layer 116 in the first gate cavity 108a, as illustrated in FIG. 2A. The space w2a may have a dimension in the range of about 2 nm to about 20 nm. Also illustrated in FIG. 2A, a space w2b is retained in between opposing portions of the WFM layer 116 over the sidewalls of the second gate cavity 108b, and the space w2b may have a dimension in the range of about 50 nm to about 290 nm.

Thereafter, the gate electrode material layer 118 is formed in the first and second gate cavities. In particular, the gate electrode material layer 118 may be deposited on the WFM layer 116 by conventional deposition processes, such as CVD, PVD or sputtering. As shown in FIG. 2A, the gate dielectric layer 112, the gate liner 114, the WFM layer 116 and the gate electrode material layer 118 are deposited over a top surface 132 of the dielectric layer 106.

In an embodiment, the gate dielectric layer 112 is a gate dielectric layer having a high-K dielectric material. The term "high-K" as used herein refers to a material having a dielectric constant (i.e., K value) that is greater than 5, preferably between 25 to 30. The high-K dielectric material may include, but not limited to, hafnium oxide ($HfO_2$), zirconium oxide ($ZrO_2$), lanthanum oxide ($La_2O_3$), aluminum oxide ($Al_2O_3$), titanium oxide ($TiO_2$), strontium titanium oxide ($SrTiO_3$), lanthanum aluminum oxide ($LaAlO_3$), yttrium oxide ($Y_2O_3$), hafnium oxynitride ($HfO_xN_y$), zirconium oxynitride ($ZrO_xN_y$), lanthanum oxynitride ($La_2O_xN_y$), aluminum oxynitride ($Al_2O_xN_y$), titanium oxynitride ($TiO_xN_y$), strontium titanium oxynitride ($SrTiO_xN_y$), lanthanum aluminum oxynitride ($LaAlO_xN_y$), yttrium oxynitride ($Y_2O_xN_y$), a silicate thereof, and an alloy thereof. Each value of x is independently from 0.5 to 3 and each value of y is independently from 0 to 2. The gate dielectric layer 112 may have a thickness in the range of about 1 nm to about 3 nm.

The gate liner 114 may have a thickness in the range of about 1 nm to about 3 nm. The gate liner 114 may include titanium nitride (TiN), aluminum-doped titanium carbide (TiAlC), or a composition thereof. The gate liner 114 may also be capable of modifying the work function property of a gate. In some embodiments, the gate liner 114 is a titanium nitride liner.

The WFM material layer 116 may include any metallic compound or a composition of metallic compounds capable of modifying the work function property of a gate. Examples of metallic compounds may include, but not limited to, Hf, Ti, Zr, Cd, La, Tl, Yb, Al, Ce, Eu, Li, Pb, Tb, Bi, In, Lu, Nb, Sm, V, Zr, Ga, Mg, Gd, Y, TiAl, TaN, Pt, Rh, Ir, Ru, Cu, Os, Be, Co, Pd, Te, Cr, Ni, a stack thereof, a conductive oxide thereof, a conductive nitride thereof, an alloy thereof, and a combination thereof. In particular, the WFM layer 116 preferably includes titanium nitride (TiN), aluminum-doped titanium carbide (TiAlC), or a composition thereof. The WFM layer 116 may have a thickness w1 in the range of about 3 nm to about 6 nm.

The gate electrode material layer 118 may include an electrically conductive material. Examples of electrically conductive materials for the gate electrode material layer 118 may include, but not limited to, tungsten, cobalt, nickel, copper, aluminum, and polysilicon.

As shown in FIG. 2A, a void 134 is formed in a portion of the gate electrode material layer 118 in the first gate cavity 108a. The void 134 may be formed due to a "pinch-off" occurring during the deposition of the gate electrode material layer 118, and the size of the void 134 may vary depending on the space w2a retained during the conformal deposition of the WFM layer 116.

Figure 2B:
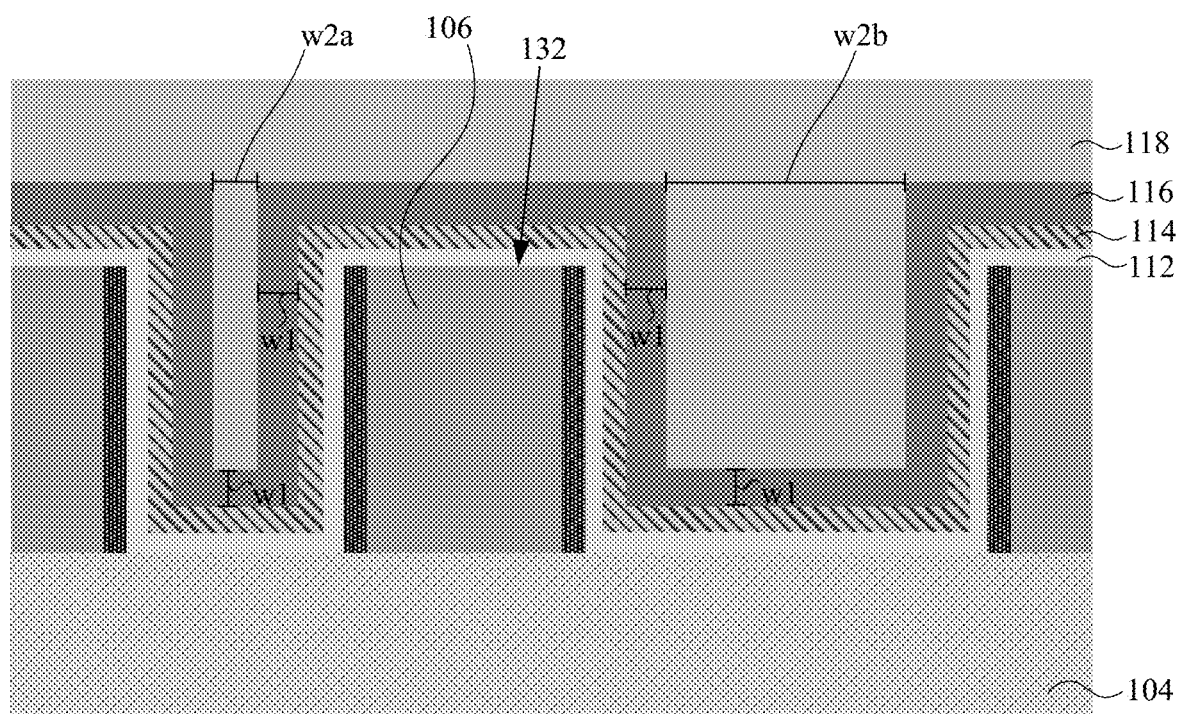
FIG. 2B illustrates another example of forming a work-function material (WFM) layer and a gate electrode material in the first and second gate cavities, in accordance with embodiments of the present disclosure.

FIG. 2B illustrates another example of forming the gate electrode material layer 118 in the first gate cavity 108a. FIG. 2B is similar to FIG. 2A, except that in FIG. 2B, the gate electrode material layer 118 completely fills the first gate cavity 108a.

Figure 3:
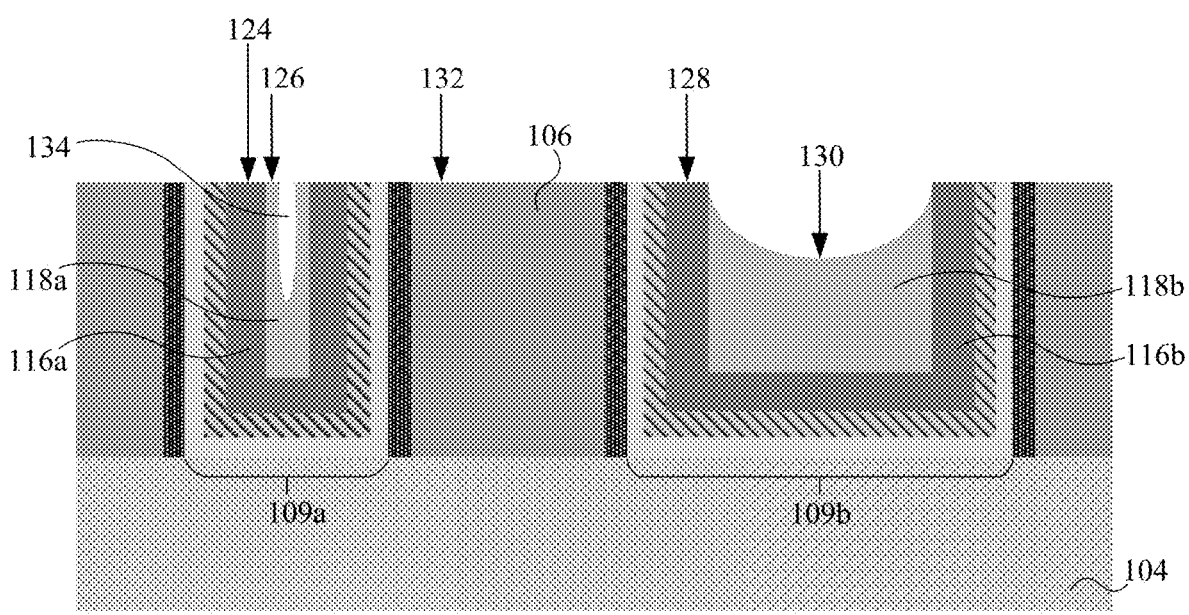

FIG. 3 illustrates formation of a first gate structure 109a in the first gate cavity and a second gate structure 109b in the second gate cavity. The first gate structure 109a may be a short channel gate structure, while the second gate structure 109b may be a long channel gate structure. The first gate structure 109a has a first WFM layer 116a and a first gate electrode 118a, while the second gate structure 109b has a second WFM layer 116b and a second gate electrode 118b.

The first and second gate structures (109a and 109b, respectively) may be formed by performing a planarization process on the structure of FIG. 2. The planarization process may include conventional chemical-mechanical polishing (CMP), and/or plasma ashing techniques. A further cleaning step may be performed after the planarization process (using a solvent or a cleaning chemical) to prepare the planar surfaces for subsequent fabrication stages. The planarization process removes portions of the gate dielectric layer 112, the gate liner 114, the WFM layer 116 and the gate electrode material layer 118 covering the dielectric layer 106 and may be stopped when the top surface 132 of the dielectric layer 106 is exposed.

Accordingly, the planarization process separates the first gate electrode 118a and the first WFM layer 116a in the first gate cavity from the second gate electrode 118b and the second WFM layer 116b in the second gate cavity. As shown in FIG. 3, the first WFM layer 116a has a top surface 124 and the first gate electrode 118a has a top surface 126. In some embodiments, the planarization process opens up the void 134 in the first gate electrode 118a. The second WFM layer 116b has a top surface 128 and the second gate electrode 118a has a top surface 130 with a concave profile.

Figure 4:
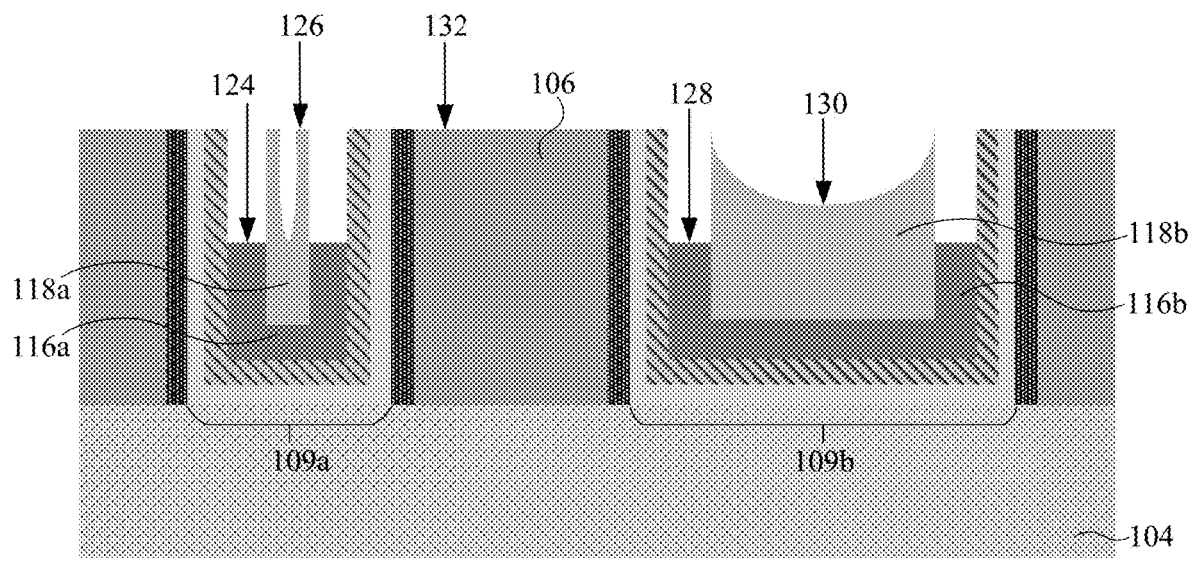

Referring to FIG. 4, the top surfaces of the first and second WFM layers (116a and 116b, respectively) in the respective first and second gate structures (109a and 109b, respectively) are recessed below the top surface 130 of the second gate electrode 118b and the top surface 132 of the dielectric layer 106. The recessing of the top surfaces of the first and second WFM layers (116a and 116b, respectively) may be performed by a selective isotropic etching process and may be controlled by a predetermined time. In an embodiment, the etching process is a selective wet etch. Exemplary etchants for the wet etch may include, but not limited to, a solution composed of water, hydrogen peroxide and ammonium hydroxide, or a hydrogen peroxide solution.

As shown in FIG. 4, a lower portion of the second gate electrode 118b is disposed in the second WFM layer 116b. The recessed top surface 124 of the first WFM layer 116a is coplanar with the recessed top surface 128 of the second WFM layer 116b. In the embodiment shown in FIG. 4, the top surface 128 of the second WFM layer 116b is recessed to a level below the lowest point of the concave profile of the top surface 130 of the second gate electrode 118b.

Figure 5:
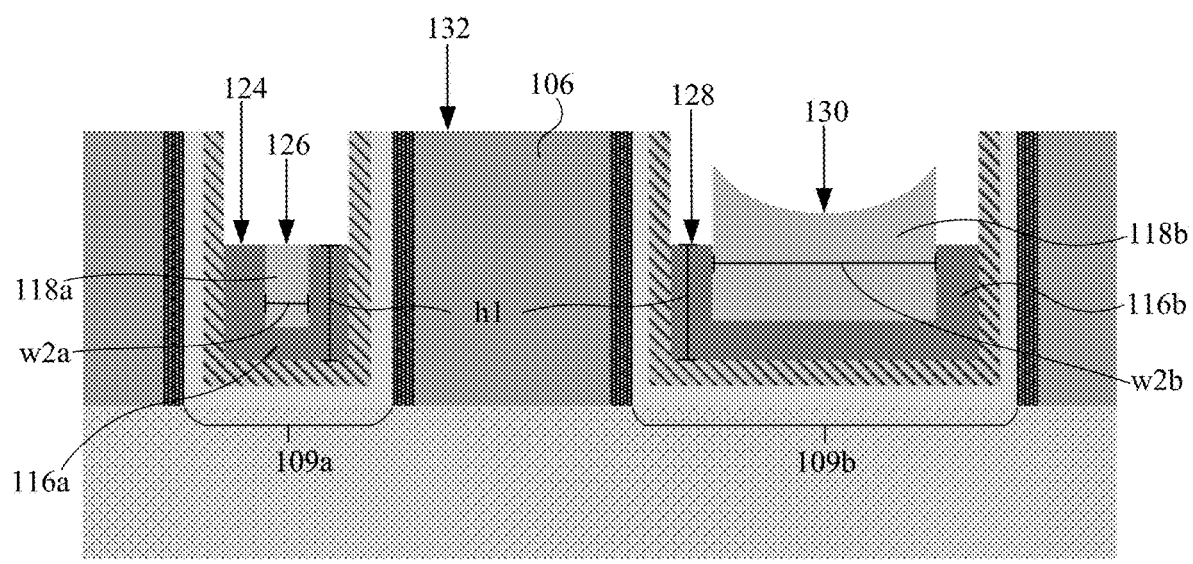

Referring to FIG. 5, the first gate electrode 118a is disposed in the first WFM layer 116a. For example, the top surface 126 of the first gate electrode 118a is recessed to a level that is coplanar with the recessed top surface 124 of the first WFM layer 116a. The recessing of the first and second gate electrodes (118a and 118b, respectively) may be performed by a selective etching process and may be controlled by a predetermined time. The etching may be isotropic or anisotropic. Exemplary etchants may include, but not limited to, boron trichloride ($BCl_3$) or hydrochloric acid solution.

Due to the difference in the amount of material and size of the upper portion of the first and second gate electrodes (118a and 118b, respectively), the rate of recessing the top surface of the first gate electrode 118a is substantially greater than that of the second electrode 118b. Hence, during the etching, the amount of material removed from the upper portion of the second gate electrode 118b is substantially lesser as compared to that of the first gate electrode 118a.

Advantageously, by controlling the space w2a retained between opposing portions of the WFM layer 116 in the first gate cavity 108a, as illustrated in FIGS. 2A and 2B, the amount of material in the first gate electrode 118a is significantly lesser relative to the amount of material in the second gate electrode 118b, which is found to significantly reduce the extent in which the top surface 130 of the second gate electrode 118b is recessed whilst ensuring the top surface 126 of the first gate electrode 118a is coplanar with the first WFM layer 116a, as illustrated in FIG. 5.

More advantageously, the presence of the void in the first gate electrode 118a is found to enhance the recession of the top surface 126 of the first gate electrode 118a by reducing the amount of material to be removed by etching and the time taken for the same, whilst ensuring minimal recessing of the top surface 130 of the second gate electrode 118b.

As shown in FIG. 5, the first gate structure 109a has the same gate height h1 as the second gate structure 109b. As used herein, the term "gate height" refers to the distance between the top and bottom surfaces of a WFM layer in a gate structure. In an embodiment, the gate height h1 has a distance in the range of about 10 nm to about 30 nm.

The first gate electrode 118a has a first width w2a that is smaller than a second width w2b of the second gate electrode 118b. Additionally, the first gate electrode has a first height that is shorter than a second height of the second gate electrode 118b. In some embodiments, the first gate electrode 118a has a width w2a in the range of about 2 nm to about 20 nm, and preferably about 2 nm to about 4 nm. The second gate electrode 118b has a width w2b in the range of about 50 nm to about 290 nm.

Advantageously, the present method is found to enable the reduction of the gate height h1 in the first gate structure 109a without increasing the degree of concavity of the top surface 130 of the second gate structure 109b, and hence, avoiding damage to the underlying second WFM layer 116b in the second gate structure 109b. More advantageously, the reduction of the gate height h1 in the first gate structure 109a is found to boost the performance of a semiconductor device. For example, the gate resistance in the first gate structure 109a can be reduced with a reduction in the gate height h1.

Figure 6:
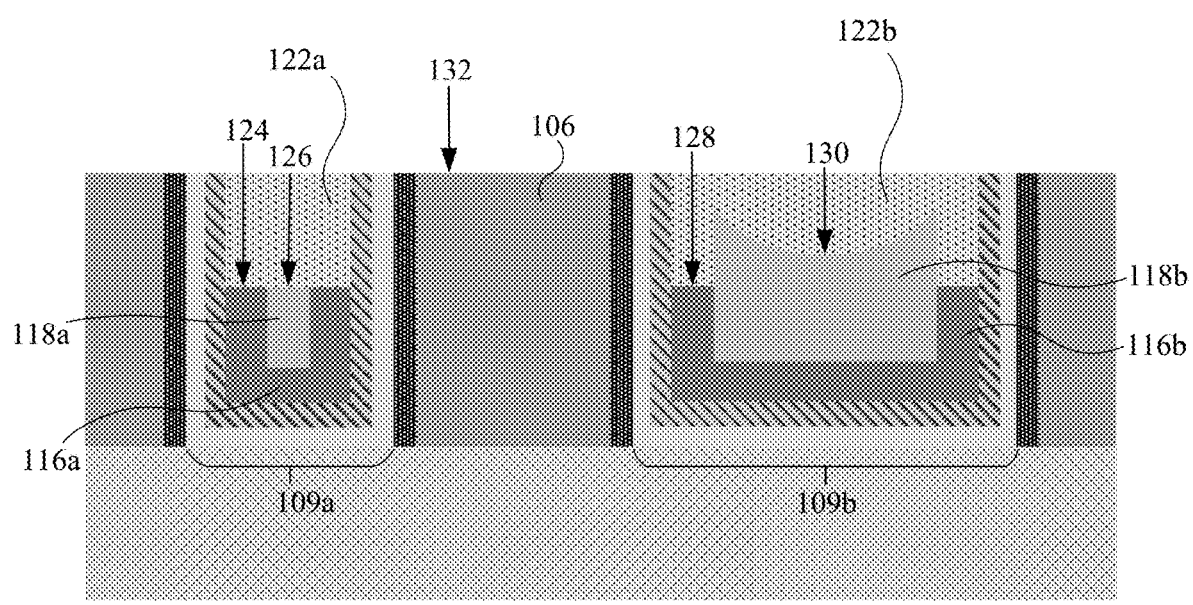

Referring to FIG. 6, first and second gate cap dielectric layers are formed over lower portions of the first and second gate structures (109a and 109b, respectively). The first and second gate cap dielectric layers may be formed using any conventional deposition process as described herein. As shown in FIG. 6, a first gate cap dielectric layer 122a is disposed on the top surface 124 of the first WFM layer 116a and the top surface 126 of the first gate electrode 118a, while a second gate cap dielectric layer 122b is disposed on the top surface 128 of the second WFM layer 116b and the top surface 130 of the second gate electrode 118b.

The first and second gate cap dielectric layers (122a and 122b, respectively) may include an oxide-containing dielectric material (e.g., silicon oxide, tetraethyl orthosilicate (TEOS), silicon-rich silicon oxide, etc.), or a nitride-containing dielectric material (e.g., silicon nitride, silicon nitride that is doped or enriched with elements selected from the group consisting of boron, carbon, and oxygen, SiBCN, SiOCN, etc.). In an embodiment, the first and second gate cap dielectric layers (122a and 122b, respectively) preferably include silicon nitride.

Figure 7:
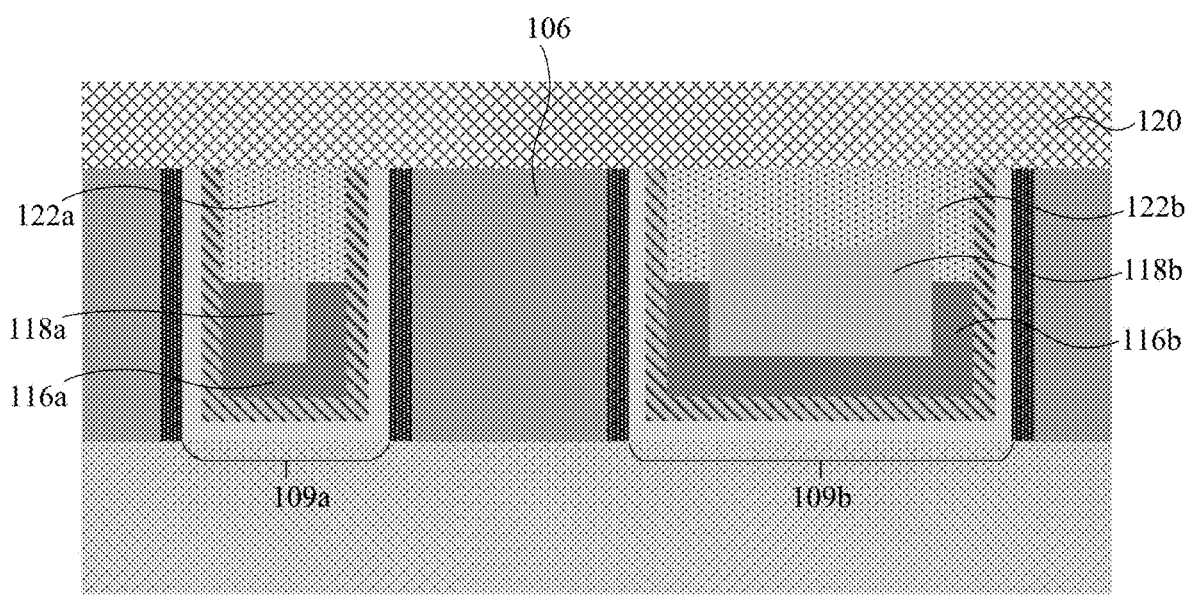

Referring to FIG. 7, an inter-layer dielectric structure 120 is formed over the first and second gate structures (109a and 109b, respectively) by any conventional deposition process as described herein. The inter-layer dielectric structure 120 may include an oxide-containing dielectric material (e.g., silicon oxide, tetraethyl orthosilicate (TEOS), silicon-rich silicon oxide, etc.). In an embodiment, the inter-layer dielectric structure 120 preferably includes TEOS.

It should also be understood that the present disclosure can be applied to any type of transistor device architecture, such as a three-dimensional device architecture (e.g., FinFETs), or a planar device architecture (e.g., complementary metal oxide semiconductor (CMOS) devices), semiconductor-on-insulator (SOI) devices).

Throughout this disclosure, the terms top, upper, upwards, over, and above refer to the direction away from the active region. Likewise, the terms bottom, lower, downwards, under, and below refer to the direction towards the active region. It is to be understood that the terms so used are interchangeable under appropriate circumstances such that the embodiments of the device described herein are, for example, capable of operation in other orientations than those illustrated or otherwise described herein.

Similarly, if a method is described herein as involving a series of steps, the order of such steps as presented herein is not necessarily the only order in which such steps may be performed, and certain of the stated steps may possibly be omitted and/or certain other steps not described herein may possibly be added to the method. Furthermore, the terms "comprise", "include", "have", and any variations thereof, are intended to cover a non-exclusive inclusion, such that a process, method, article, or device that comprises a list of elements is not necessarily limited to those elements, but may include other elements not expressly listed or inherent to such process, method, article, or device. Occurrences of the phrase "in one embodiment" or "in an embodiment" herein do not necessarily all refer to the same embodiment.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein. Furthermore, there is no intention to be bound by any theory presented in the preceding background or the following detailed description.

Additionally, the various tasks and processes described herein may be incorporated into a more comprehensive procedure or process having additional functionality not described in detail herein. In particular, various processes in the manufacture of integrated circuits are well-known and so, in the interest of brevity, many conventional processes are only mentioned briefly herein or omitted entirely without providing the well-known process details.

As will be readily apparent to those skilled in the art upon a complete reading of the present application, the methods of forming the semiconductor structure disclosed herein may be employed in replacement metal gate processes for forming gate electrode components on a semiconductor device, and may be employed in manufacturing a variety of different integrated circuit products, including, but not limited to, logic products, memory products, 3D transistor devices, FinFET transistor devices, planar transistor devices, CMOS devices, SOI devices etc.

What is claimed is:
1. A semiconductor device comprising:
    first and second gate structures disposed in a dielectric layer above an active region, the first gate structure has a first width that is smaller than a second width of the second gate structure;

a lower portion of the first gate structure having a first work-function material (WFM) layer, the first WFM layer having a top surface;
a lower portion of the second gate structure having a second WFM layer, the second WFM layer having a top surface; and
a first gate electrode disposed in the first WFM layer and a second gate electrode having a lower portion disposed in the second WFM layer, wherein the first gate electrode has a first width that is smaller than a second width of the second gate electrode, and wherein the top surface of the second WFM layer is at a level below a top surface of the second gate electrode, and the top surface of the first WFM layer is coplanar with a top surface of the first gate electrode.

2. The semiconductor device of claim 1, further comprising the width of the first gate electrode is in the range of 2 nm to 20 nm.

3. The semiconductor device of claim 1, further comprising the width of the second gate electrode is in the range of 50 nm to 290 nm.

4. The semiconductor device of claim 1, wherein the top surface of the first WFM layer is coplanar with the top surface of the second WFM layer.

5. The semiconductor device of claim 1, wherein the first gate electrode has a first height that is shorter than a second height of the second gate electrode.

6. The semiconductor device of claim 1, wherein the top surface of the second gate electrode has a concave surface profile.

7. The semiconductor device of claim 6, wherein the top surface of the second WFM layer is at a level below the lowest point of the concave surface profile.

8. The semiconductor device of claim 1, further comprising a first and a second gate cap dielectric layers disposed on the lower portions of the first and second gate structures, respectively.

9. The semiconductor device of claim 8, wherein the first gate cap dielectric layer has side surfaces covered by the gate dielectric layer in the first gate structure and the second gate cap dielectric layer has side surfaces covered by the gate dielectric layer in the second gate structure.

10. The semiconductor device of claim 1, wherein the lower portions of the first and second gate structures have a gate height in the range of 10 nm to 30 nm.

11. A semiconductor device comprising:
a long channel and a short channel gate structures disposed in a dielectric layer above an active region, the long channel gate structure having a channel length that is longer than the short channel gate structure;
a lower portion of the short channel gate structure having a first work-function material (WFM) layer, the first WFM layer having a top surface;
a lower portion of the long channel gate structure having a second WFM layer, the second WFM layer having a top surface;
a first gate electrode disposed in the first WFM layer and a second gate electrode having a lower portion disposed in the second WFM layer;
the first gate electrode having a first width that is smaller than a second width of the second gate electrode;
a gate dielectric layer in the short channel gate structure;
a gate dielectric layer in the long channel gate structure;
a first gate cap dielectric layer disposed on the lower portion of the short channel gate structure; and
a second gate cap dielectric layer disposed on the lower portion of the long channel gate structure, wherein the first gate cap dielectric layer has side surfaces covered by the gate dielectric layer in the short channel gate structure and the second gate cap dielectric layer has side surfaces covered by the gate dielectric layer in the long channel gate structure.

12. The semiconductor device of claim 11, wherein the top surface of the second WFM layer is at a level below a top surface of the second gate electrode, and the top surface of the first WFM layer is coplanar with a top surface of the first gate electrode.

13. The device of claim 11, wherein a top surface of the second gate electrode has a concave surface profile.

14. The device of claim 11, wherein the first gate electrode has a first height that is shorter than a second height of the second gate electrode.

15. A method of forming structures in a semiconductor device comprising:
forming first and second gate cavities having sidewalls and bottom surfaces in a dielectric layer, wherein the first gate cavity has a width that is smaller than a width of the second gate cavity;
forming a first gate structure in the first gate cavity by forming a first work-function material (WFM) layer with a top surface, followed by forming a first gate electrode with a top surface in the first WFM layer;
forming a second gate structure in the second gate cavity by forming a second WFM layer with a top surface, followed by forming a second gate electrode with a top surface in the second WFM layer;
recessing the top surfaces of the first and second WFM layers to a level below the top surface of the second gate electrode;
recessing the top surface of the first gate electrode to a level coplanar with the recessed top surface of the first WFM layer; and
forming a first gate cap dielectric layer over the first WFM layer and the first gate electrode and a second gate cap dielectric layer over the second WFM layer and the second gate electrode.

16. The method of claim 15, wherein the formation of the first and second gate structures further comprises:
depositing a conformal WFM layer over the dielectric layer including the sidewalls and bottom surfaces of the first and second gate cavities;
depositing a gate electrode material layer on the conformal WFM layer; and
performing a planarization process to remove portions of the conformal WFM layer and the gate electrode material layer covering the dielectric layer to separate the first gate electrode and the first WFM layer in the first gate cavity from the second gate electrode and the second WFM layer in the second gate cavity.

17. The method of claim 16, further comprising controlling the conformal deposition of the WFM layer to retain a space between opposing portions of the WFM layer over the sidewalls of the first gate cavity.

18. The method of claim 17, wherein the space is in the range of 2 nm to 20 nm.

19. The method of claim 16, wherein the formation of the gate electrode material layer forms a void in a portion of the gate electrode material layer in the first gate cavity.

20. The method of claim 16, wherein the formation of the gate electrode material layer completely fills the first gate cavity.

* * * * *